(12) United States Patent
Park et al.

(10) Patent No.: US 12,457,880 B2
(45) Date of Patent: Oct. 28, 2025

(54) ELECTRONIC DEVICE AND METHOD OF MANUFACTURING THE SAME

(71) Applicant: Samsung Display Co., Ltd., Yongin-si (KR)

(72) Inventors: Sungkyun Park, Suwon-si (KR); Jungha Son, Yongin-si (KR); Sangkyu Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/197,097

(22) Filed: May 14, 2023

(65) Prior Publication Data

US 2023/0284493 A1 Sep. 7, 2023

Related U.S. Application Data

(63) Continuation of application No. 17/131,398, filed on Dec. 22, 2020, now Pat. No. 11,653,537, which is a
(Continued)

(30) Foreign Application Priority Data

Jun. 20, 2016 (KR) .......................... 10-2016-0076720

(51) Int. Cl.
*H10K 59/40* (2023.01)
*H10K 50/84* (2023.01)
(Continued)

(52) U.S. Cl.
CPC ............. *H10K 59/40* (2023.02); *H10K 50/84* (2023.02); *H10K 50/865* (2023.02);
(Continued)

(58) Field of Classification Search
CPC ...... H10K 59/40; H10K 50/84; H10K 50/865; H10K 59/122; H10K 59/131; H10K 71/00;
(Continued)

(56) References Cited

U.S. PATENT DOCUMENTS 8,363,030 B2 * 1/2013 Lee .......................... G01L 1/16
345/174
8,373,624 B2 2/2013 Chan et al.
(Continued)

FOREIGN PATENT DOCUMENTS

CN 102405457 4/2012
CN 102736777 10/2012
(Continued)

OTHER PUBLICATIONS

Non-Final Office Action dated Jan. 25, 2018 in U.S. Appl. No. 15/623,949.
(Continued)

*Primary Examiner* — Tan N Tran
(74) *Attorney, Agent, or Firm* — Womble Bond Dickinson (US) LLP

(57) ABSTRACT

An electronic device including a base structure, a first pattern having at least one projection disposed on the base structure, a first conductive layer including a first portion disposed on the base structure and a second portion disposed on the first pattern and connected to the first portion, an insulating layer disposed on the first conductive layer covering the first portion and exposing the second portion, and a second conductive layer provided on the insulating layer and overlapping the first conductive layer. The second conductive layer is spaced apart from the first portion and is in contact with the second portion. Methods of manufacturing an electronic device capable of reducing the number of
(Continued)

process steps in the manufacturing process are also disclosed.

26 Claims, 14 Drawing Sheets

Related U.S. Application Data continuation of application No. 16/356,156, filed on Mar. 18, 2019, now Pat. No. 10,879,337, which is a continuation of application No. 15/623,949, filed on Jun. 15, 2017, now Pat. No. 10,269,889.

(51) Int. Cl.
| | |
|---|---|
| H10K 50/86 | (2023.01) |
| H10K 59/122 | (2023.01) |
| H10K 59/131 | (2023.01) |
| H10K 71/00 | (2023.01) |
| H10K 59/80 | (2023.01) |

(52) U.S. Cl.
CPC ......... *H10K 59/122* (2023.02); *H10K 59/131* (2023.02); *H10K 71/00* (2023.02); *H10K 59/87* (2023.02); *H10K 59/873* (2023.02)

(58) Field of Classification Search
CPC .. H10K 59/87; H10K 59/873; H10K 59/8792; H10K 59/88; G09F 9/335; G09F 9/35; G09F 9/372; G02B 26/005; G06F 3/0412; G06F 2203/04102; G06F 3/041
USPC ...................................................... 257/59, 72
See application file for complete search history.

(56) References Cited

U.S. PATENT DOCUMENTS

| | | | |
|---|---|---|---|
| 8,624,849 B2 | 1/2014 | Chang et al. | |
| 8,743,078 B2 | 6/2014 | Kim | |
| 8,896,236 B2 | 11/2014 | Jung et al. | |
| 9,082,668 B2* | 7/2015 | Kim | H10K 59/38 |
| 9,256,097 B2 | 2/2016 | Kim et al. | |
| 9,292,118 B2 | 3/2016 | Lee et al. | |
| 9,583,549 B2 | 2/2017 | You | |
| 9,727,195 B2 | 8/2017 | Kim et al. | |
| 9,853,092 B2 | 12/2017 | Lee et al. | |
| 9,977,272 B2* | 5/2018 | Lee | G02F 1/133512 |
| 10,091,872 B2 | 10/2018 | Kim et al. | |
| 10,409,432 B2* | 9/2019 | Cho | G06F 3/0445 |
| 10,444,884 B2 | 10/2019 | Lee et al. | |
| 2013/0020967 A1 | 1/2013 | Jung et al. | |
| 2013/0057497 A1 | 3/2013 | Cho et al. | |
| 2013/0162570 A1 | 6/2013 | Shin et al. | |
| 2013/0299968 A1 | 11/2013 | Lin et al. | |
| 2014/0160377 A1 | 6/2014 | Yamagishi et al. | |
| 2014/0217373 A1 | 8/2014 | Youn et al. | |
| 2014/0375911 A1 | 12/2014 | Lee | |
| 2015/0029135 A1 | 1/2015 | Han | |
| 2015/0049030 A1 | 2/2015 | Her | |
| 2015/0185917 A1 | 7/2015 | Song et al. | |
| 2015/0346866 A1 | 12/2015 | Kusunoki et al. | |
| 2016/0041643 A1 | 2/2016 | Gu et al. | |
| 2016/0048248 A1 | 2/2016 | Na et al. | |
| 2016/0070395 A1 | 3/2016 | Hung et al. | |
| 2016/0103516 A1 | 4/2016 | An | |
| 2016/0104869 A1* | 4/2016 | Choi | H10K 59/122 257/40 |
| 2016/0276174 A1 | 9/2016 | Kim et al. | |
| 2016/0285049 A1 | 9/2016 | Song et al. | |
| 2018/0101258 A1 | 4/2018 | Cho et al. | |

FOREIGN PATENT DOCUMENTS

| | | |
|---|---|---|
| CN | 102981669 | 3/2013 |
| CN | 103855188 | 6/2014 |
| CN | 104331184 | 2/2015 |
| CN | 204515751 | 7/2015 |
| CN | 105511665 | 4/2016 |
| CN | 105609521 | 5/2016 |
| JP | 2013195331 | 9/2013 |
| KR | 10-2002-0002013 | 1/2002 |
| KR | 10-2011-0014837 A | 2/2011 |
| KR | 20130009520 | 1/2013 |
| KR | 10-2014-0035789 | 3/2014 |
| KR | 20140035788 | 3/2014 |
| KR | 10-2014-0099164 | 8/2014 |
| KR | 10-2015-0020929 | 2/2015 |
| KR | 10-2015-0033784 | 4/2015 |
| KR | 10-2015-0058629 | 5/2015 |
| KR | 10-1524449 | 6/2015 |
| KR | 10-2015-0075723 | 7/2015 |
| KR | 10-2015-0118465 | 10/2015 |
| KR | 10-2016-0020987 | 2/2016 |
| TW | 201403723 | 1/2014 |

OTHER PUBLICATIONS

Final Office Action dated Jun. 26, 2018 in U.S. Appl. No. 15/623,949.
Advisory Action dated Sep. 24, 2018 in U.S. Appl. No. 15/623,949.
Notice of Allowance dated Dec. 4, 2018 in U.S. Appl. No. 15/623,949.
Non-Final Office Action dated Oct. 31, 2019, in U.S. Appl. No. 16/356,156.
Final Office Action dated Apr. 8, 2020, in U.S. Appl. No. 16/356,156.
Notice of Allowance dated Aug. 25, 2020, in U.S. Appl. No. 16/356,156.
Non-Final Office Action dated, in U.S. Patent Application No.
Korean Office Action dated Nov. 8, 2022, in Korean Patent Application No. 10-2016-0076720.
Non-Final Office Action dated Jun. 9, 2022, in U.S. Appl. No. 17/131,398.
Notice of Allowance dated Jan. 10, 2023, in U.S. Appl. No. 17/131,398.

* cited by examiner

ELECTRONIC DEVICE AND METHOD OF MANUFACTURING THE SAME

CROSS-REFERENCE TO RELATED APPLICATION

This application is a continuation of U.S. patent application Ser. No. 17/131,398, filed on Dec. 22, 2020, which is a continuation of U.S. patent application Ser. No. 16/356,156, filed on May 18, 2019, issued as U.S. Pat. No. 10,879,337, which is a continuation of U.S. patent application Ser. No. 15/623,949, filed Jun. 15, 2017, issued as U.S. Pat. No. 10,269,889, which claims priority from and the benefit of Korean Patent Application No. 10-2016-0076720, filed on Jun. 20, 2016, which is hereby incorporated by reference for all purposes as if fully set forth herein.

BACKGROUND

Field

The invention relates generally to an electronic device and a method of manufacturing the same, and, more particularly, to a method of manufacturing an electronic display device more easily and the electronic display device manufactured thereby.

Discussion of the Background

An electronic device is activated in response to an electrical signal. The electronic device may include a display device, which is configured to display an image, or a touch screen, which is configured to sense a touch event from the outside.

The electronic device may also include various electrode patterns, which are used to transmit an electrical signal for activating the electronic device. The electrode patterns may also be used to transmit electric signals, which are used to display information or are produced by a touch event from the outside.

Manufacturing of electronic display devices, particularly those with touch screens, is complex as multiple layers of electrode patterns are required to be made in a multiple semi-conductor processing steps. The more layers the more complex processing steps are required and the device becomes thicker as more layers are added.

The above information disclosed in this Background section is only for enhancement of understanding of the background of the inventive concepts, and, therefore, it may contain information that does not form the prior art that is already known in this country to a person of ordinary skill in the art.

SUMMARY

Electronic devices constructed according to the principles of the invention enable two conductive patterns at different levels to be more easily coupled to each other than in conventional devices.

Methods of manufacturing an electronic device according to the principles of the invention are capable of reducing the number of process steps in the manufacturing process. For example, step patterns may be provided to connect two conductive patterns disposed at different levels to each other without needing to etch or otherwise engage in a process step to form a contact hole.

Additional aspects will be set forth in the detailed description which follows, and, in part, will be apparent from the disclosure, or may be learned by practice of the inventive concepts.

According to one aspect of the invention, an electronic device includes a base structure, a first pattern having at least one projection, a first conductive layer, an insulating layer, and a second conductive layer provided on the insulating layer and overlapping the first conductive layer.

The at least one projection may be disposed on the base structure.

The first conductive layer may include a first portion disposed on the base structure and a second portion, disposed on the first pattern and connected to the first portion.

The insulating layer may be disposed on the first conductive layer covering the first portion and exposing the second portion.

The second conductive layer may be spaced apart from the first portion and may be in contact with the second portion.

The insulating layer may have a thickness that is substantially equal to a sum of thicknesses of the first pattern and the second portion.

A top surface of the second portion of the first conductive layer may be exposed through the insulating layer, and the top surface of the second portion may be substantially coplanar with that of the insulating layer.

The first conductive layer may include a plurality of first sensor portions, a plurality of first connecting portions, each of which is provided between the first sensor portions and connects adjacent ones of the first sensor portions, and a plurality of first dummy patterns, which are electrically disconnected from the first sensor portions and the first connecting portions.

The second conductive layer may include a plurality of second sensor portions, a plurality of second connecting portions, each of which is provided between adjacent ones of the second sensor portions and connects the adjacent ones of the second sensor portions, and a plurality of second dummy patterns, which are electrically disconnected from the second sensor portions and the second connecting portions.

The first pattern may be a plurality of step patterns, each of the plurality of step patterns overlaps a corresponding one of the first sensor portions. The second portion of each of the plurality of first sensor portions may be connected to the plurality of second dummy patterns.

The step pattern may include a plurality of step patterns, each of the plurality of step pattern overlaps a corresponding one of the plurality of first sensor portions and a corresponding one of the plurality of first dummy patterns. The second portion of each of the plurality of first sensor portions may be connected to the plurality of second dummy patterns and the second portion of each of the plurality of first dummy patterns may be connected to the plurality of second sensor portions.

The second conductive layer may include a plurality of first sensor portions, a plurality of first connecting portions, each of which is provided between adjacent ones of the first sensor portions and connects the adjacent ones of the first sensor portions, and a plurality of second sensor portions, which are electrically disconnected from the first sensor portions and the plurality of first connecting portions.

The first conductive layer may include a plurality of second connecting portions, each intersecting a corresponding one of the plurality of first connecting portions.

The first pattern may be a plurality of step patterns, each of the plurality of step patterns overlap a corresponding one of the plurality of second connecting portions. The second portion may be defined in the plurality of second connecting portions to be connected to the plurality of second sensor portions.

The first pattern may include an organic material.

The electronic device may further include a display layer provided on the base structure to display an image and a thin-film encapsulation layer provided on the display layer to cover the display layer. The first conductive layer may be disposed on the thin-film encapsulation layer.

The display layer may include a first electrode, a pixel defining layer which defines an opening exposing at least a portion of the first electrode, a light emitting layer provided in the opening, and a second electrode provided on the light emitting layer.

Each of the first and second conductive layers may overlap the pixel defining layer and might not overlap the opening.

Each of the first and second conductive layers may include a plurality of mesh lines.

The second portion may include at least one of the plurality of mesh lines.

The electronic device may further include a black matrix overlapping the pixel defining layer.

A width of a portion of the black matrix may be substantially the same as that of a portion of the pixel defining layer that overlaps the portion of the black matrix.

The first pattern may be black.

A width of a portion of the black matrix that overlaps the first pattern may be substantially the same as that of a portion of the plurality of mesh lines that overlaps the portion of the black matrix, when measured in a first direction.

According to another aspect of the invention, a method of manufacturing an electronic device may include providing a base structure, forming a first pattern having at least one projection on the base structure, forming a first conductive layer including a first portion and a second portion, the first portion being disposed on the base structure and the second portion being disposed on the first pattern, forming a preliminary insulating layer on the base structure covering the first conductive layer and the first pattern, etching the preliminary insulating layer to form an insulating layer covering the first portion and exposing a top surface of the second portion, and forming a second conductive layer on the insulating layer and the first conductive layer.

The etching of the preliminary insulating layer may be performed using a dry etching process.

The step of forming the first pattern may include forming a step pattern. The step of forming the insulating layer may include forming the insulating layer to have a thickness substantially equal to a sum of thicknesses of the step pattern and a portion of the first conductive layer positioned on the step pattern, and the top surface of the first conductive layer positioned on the step pattern may be substantially coplanar with a top surface of the insulating layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

Figure 1:
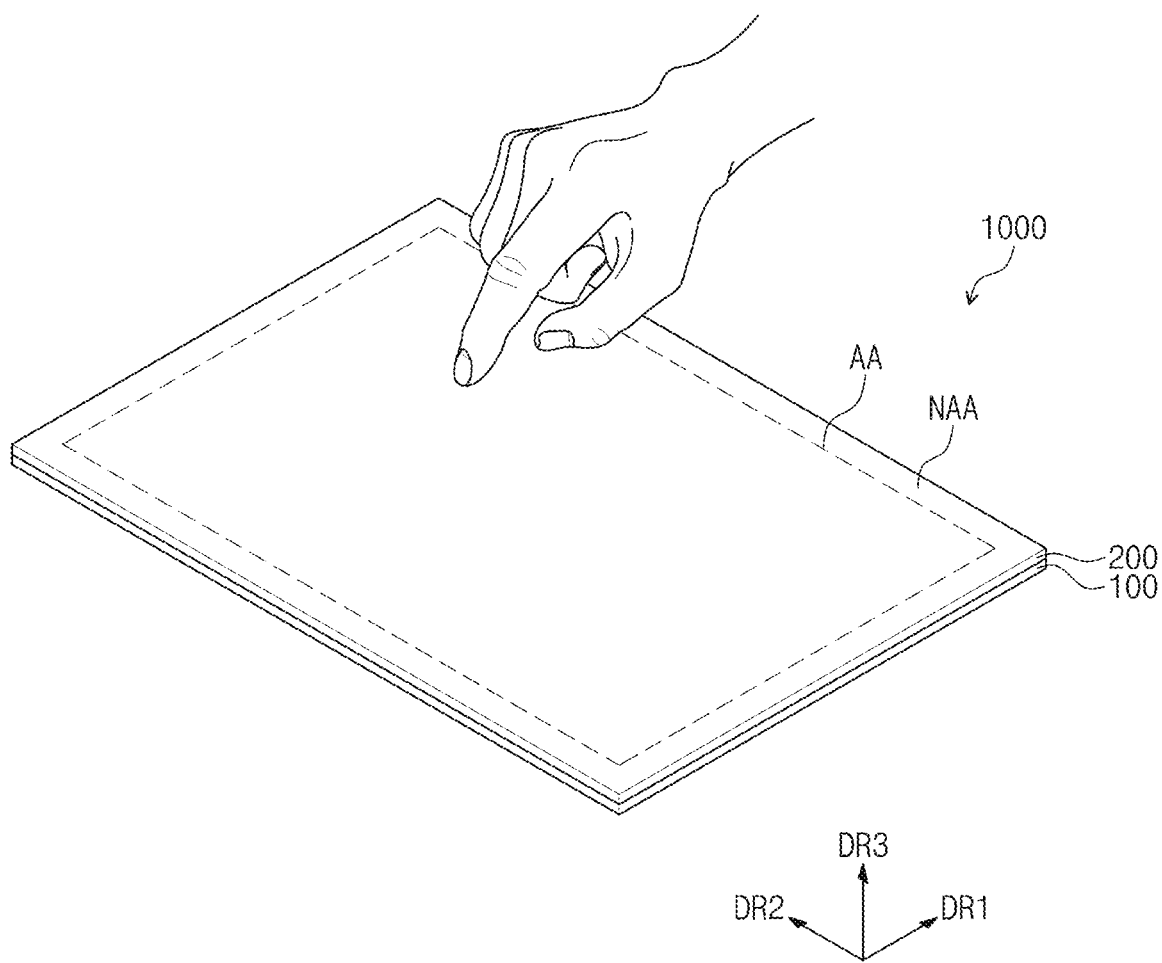
FIG. 1 is a perspective view of a first embodiment of an electronic device constructed according to the principles of the invention.

It should be noted that these figures are intended to illustrate the general characteristics of methods, structure and/or materials utilized in certain example embodiments and to supplement the written description provided below. These drawings are not, however, to scale and might not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As shown in FIG. 1, an electronic device 1000 may be configured to sense an external touch event, e.g. touching the device with a finger or implement from the outside. Elsewhere herein, a touch event may be referred to as merely a "touch" for the sake of simplicity. The electronic device 1000 may be a touch screen or a touchable display device.

The touch event from the outside may occur in various manners. FIG. 1 illustrates an example in which a touch event is detected when a part of the human body such as a user's hand approaches or is in contact with the electronic device 1000.

However, the electronic device 1000 may also detect a state, in which a part of an inanimate object such as a stylus pen approaches or is in contact with the electronic device 1000, as the touch event. Furthermore, the electronic device 1000 may detect an external touch event using various sensing elements such as optical, contact-sensitive, heat-sensitive, and magnetic elements.

The electronic device 1000 may include an active area AA and a peripheral area NAA, when viewed in plan. The active area AA may be activated to sense an external touch event, when an electrical signal is applied thereto.

The active area AA may be defined in a center of the electronic device 1000. However, depending on the intended use of the electronic device 1000, the active area AA may be defined to be in another location, e.g., offset toward an edge or a side of the electronic device 1000.

The peripheral area NAA may be defined to be adjacent to the active area AA. The electronic device 1000 may be designed to not detect an external touch event applied to the peripheral area NAA.

FIG. 1 illustrates an example in which the peripheral area NAA is defined in the form of a frame surrounding the active area AA. However, other configurations are possible, e.g., the peripheral area NAA may have various shapes. In certain embodiments, the electronic device 1000 may have a top surface, which is defined by first and second (e.g., x and y) directions DR1 and DR2 that are not parallel to each other; and, the entirety of the top surface of the electronic device 1000 may be defined as the active area AA, such that the peripheral area NAA may be omitted.

The electronic device 1000 may include a base structure 100 and a touch structure 200. The base structure 100 may be used to dispose the touch structure 200 thereon. That is, the base structure 100 may be used as a substrate upon which the touch structure 200 is disposed.

For example, the base structure 100 may be an insulating substrate or an insulating film that is formed of an insulating material (e.g., glass or polymer resin). When the base structure 100 is an insulating substrate, the electronic device 1000 may have an increased hardness. When the base structure 100 is an insulating film, the electronic device 1000 may have increased flexibility.

The base structure 100 may include be a multi-layered structure, in which a plurality of organic layers and/or a plurality of inorganic layers are stacked. This may make it possible for the electronic device 1000 to be thinner.

The structure of the base structure 100 may be changed from the examples given above.

The touch structure 200 may be provided on one of surfaces of the base structure 100. In FIG. 1 the touch structure 200 is provided on a top surface of the base structure 100, but other orientations are permissible. For example, the touch structure 200 may be provided on a bottom surface of the base structure 100.

Figure 2:
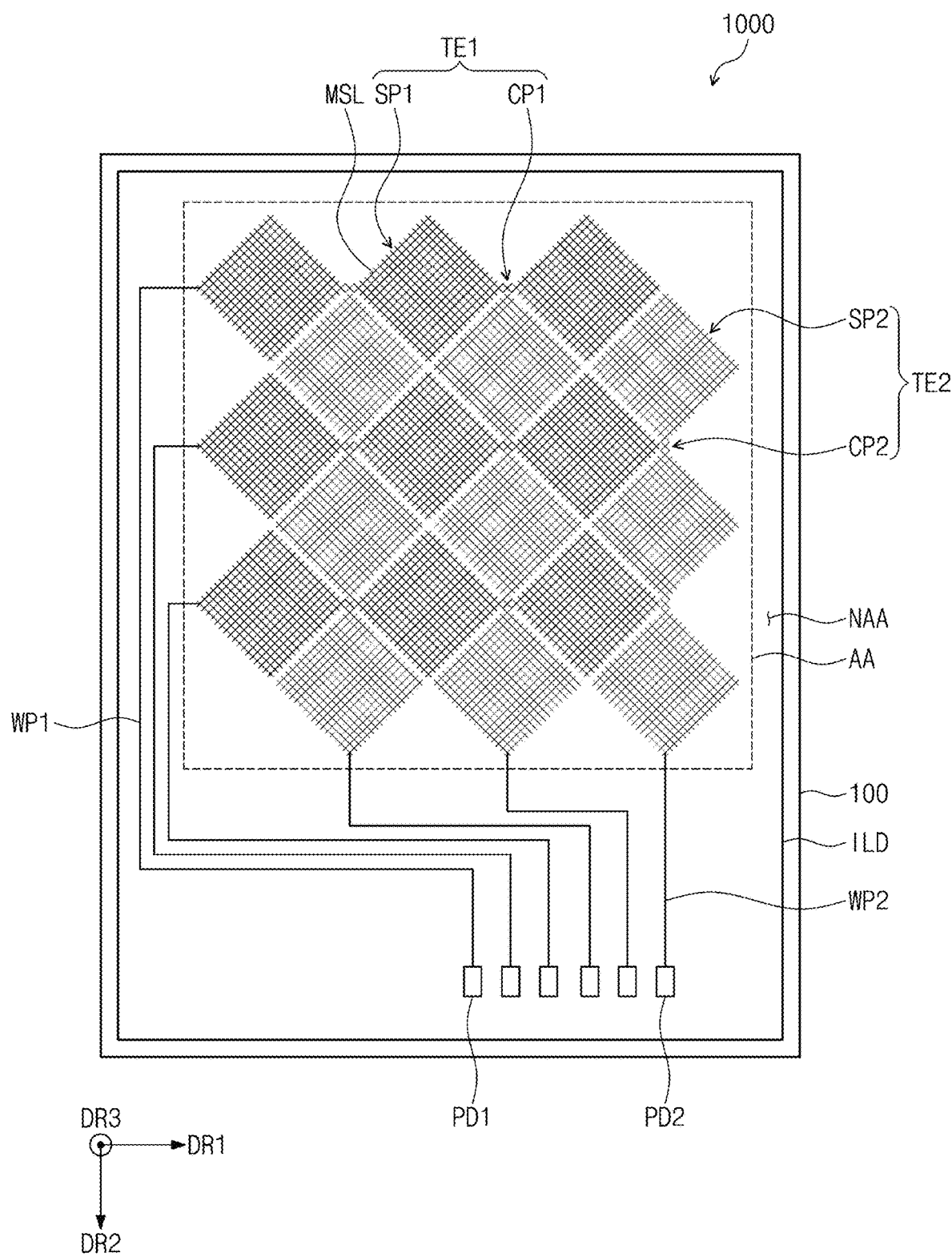
FIG. 2 is a plan view of the electronic device of FIG. 1.

The touch structure 200 may be configured to detect a touch event from the outside. As shown in FIG. 2, the touch structure 200 may include a plurality of first electrodes TE1, a plurality of second electrodes TE2, a plurality of first wiring patterns WP1, a plurality of second wiring patterns WP2, a plurality of first pads PD1, and a plurality of second pads PD2.

Although, in FIG. 2, the first electrodes TE1, the second electrodes TE2, the first wiring patterns WP1, the second wiring patterns WP2, the first pads PD1, and the second pads PD2 are arranged on a single layer, other configurations are possible. For example, at least two or all of these components may be disposed on different layers.

The first electrodes TE1 and the second electrodes TE2 may be provided in the active area AA. The electronic device 1000 may further include an insulating layer ILD which is used to electrically separate the first and second electrodes TE1 and TE2 from each other.

As is known in the art, the first electrodes TE1 may be used to output sensing signals, whereas the second electrodes TE2 may be used to receive driving signals. In the electronic device 1000, the driving signals may be applied to the second electrodes TE2 and such driving signals may be used to scan the active area AA. Also, in the electronic device 1000, the sensing signals may be output from the first electrodes TE1 and may be used to sense a region where a touch occurs.

Alternatively, or additionally, the first electrodes TE1 may be used to receive the driving signals, and the second electrodes TE2 may be used to output the sensing signals. In addition, the first and second electrodes TE1 and TE2 may also be used to receive or output other electrical signals.

The first electrodes TE1 may extend in the first direction DR1 and may be arranged in the second direction DR2.

Each of the first electrodes TE1 may include a plurality of first sensor portions SP1 and a plurality of first connecting portions CP1. The first sensor portions SP1 may be arranged in the first direction DR1 and each of the first connecting portions CP1 may be provided to connect the first sensor portions SP1 to each other.

The second electrodes TE2 may extend in the second direction DR2 and may be arranged in the first direction DR1. Each of the second electrodes TE2 may include a plurality of second sensor portions SP2 and a plurality of second connecting portions CP2. The second sensor portions SP2 may be arranged in the second direction DR2 and each of the second connecting portions CP2 may be provided to connect the second sensor portions SP2 to each other.

Each of the first and second sensor portions SP1 and SP2 may include a plurality of mesh lines MSL. Accordingly, the first electrodes TE1 and the second electrodes TE2 may have an improved flexibility and thus the electronic device 1000 may be easier to fold.

Alternatively, at least one of the first and second sensor portions SP1 and SP2 may be provided in a bulk structure, not in the mesh structure.

The first wiring patterns WP1 and the second wiring patterns WP2 may be provided in the peripheral area NAA. The first wiring patterns WP1 may be respectively connected to the first electrodes TE1 and the second wiring patterns WP2 may be respectively connected to the second electrodes TE2.

The first and second pads PD1 and PD2 may be provided in the peripheral area NAA. The first and second pads PD1 and PD2 may be connected to the first and second wiring patterns WP1 and WP2, respectively.

The electronic device 1000 may receive a power voltage from an external power supply through the first and second pads PD1 and PD2 and/or output a signal that corresponds to an external touch event sensed through the active area AA, to the outside through the first and second pads PD1 and PD2.

The first and second pads PD1 and PD2 are shown sequentially arranged, but the first and second pads PD1 and PD2 may be arranged in an alternating or partially-separated manner or in some other arrangement.

The touch structure 200 may be operated to detect an external touch event through an electrostatic capacitance coupling between the first electrodes TE1 and the second electrodes TE2 or in an electrostatic capacitance manner. However, the touch structure 200 may sense an external touch in various other manners, such as resistance layer, optical, ultrasonic wave, or coordinate recognition manners, and may have an electrode structure corresponding thereto.

Figure 3A:
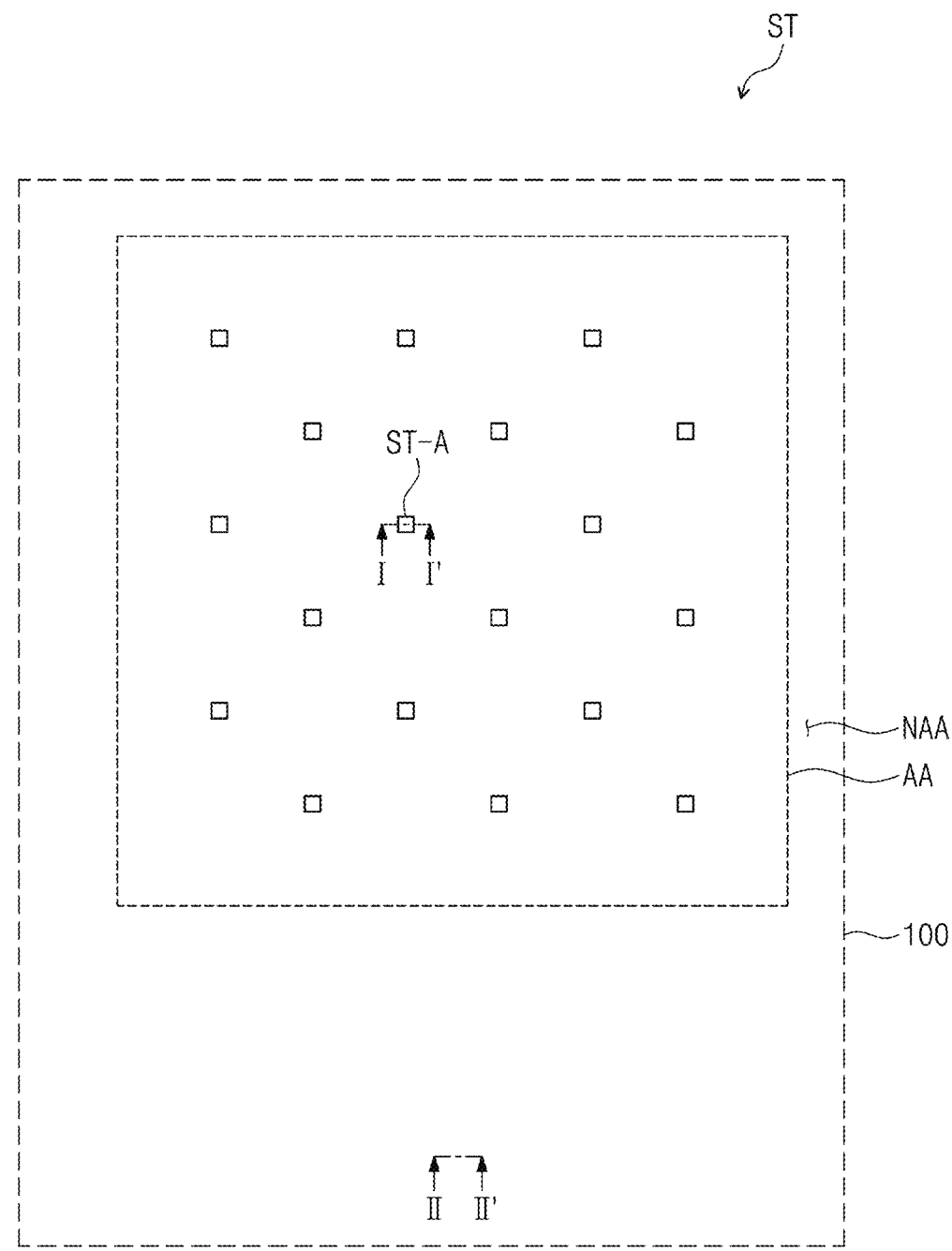
FIGS. 3A to 3D are plan views of various layers of the electronic device of FIG. 1.
Figure 3B:
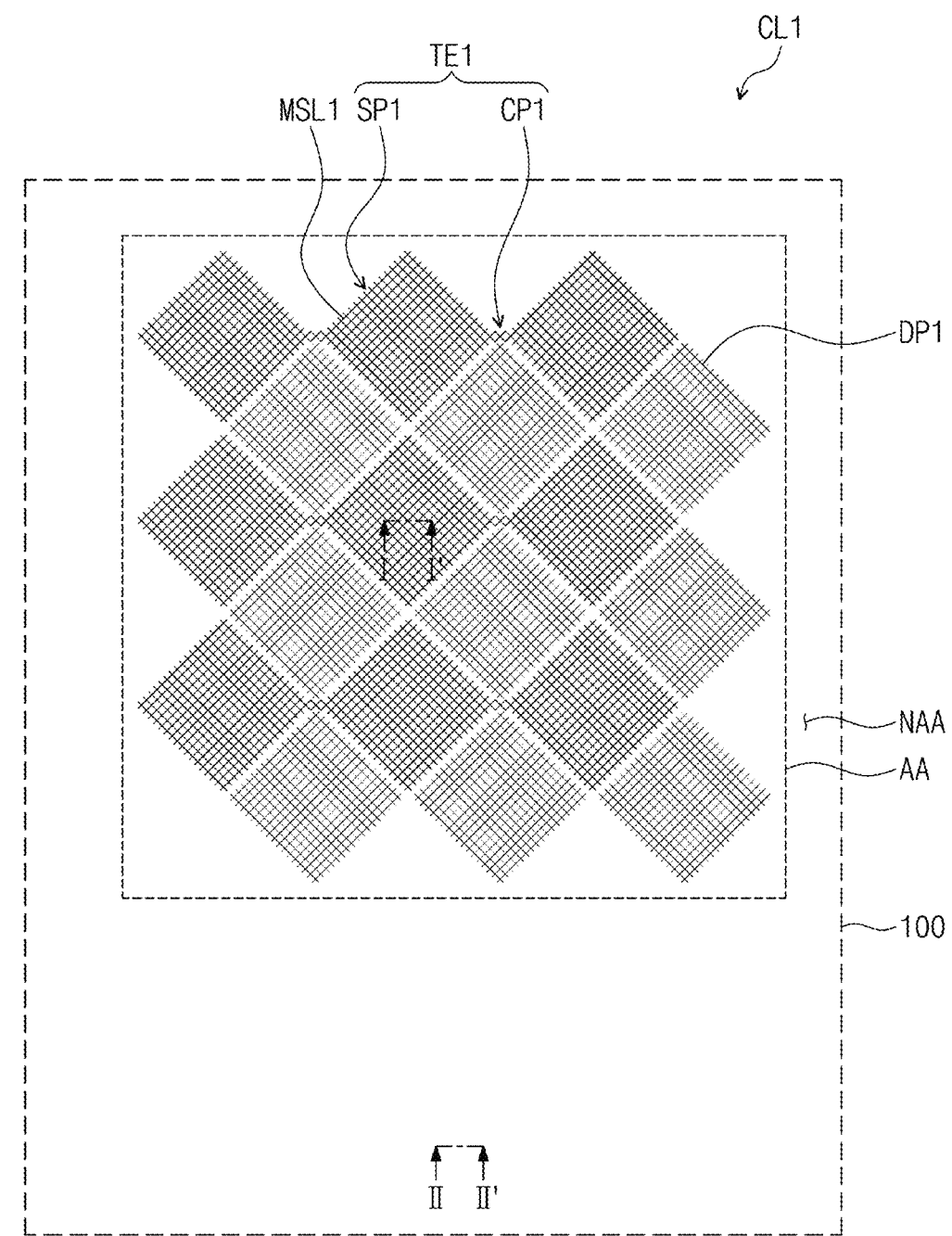
Figure 3C:
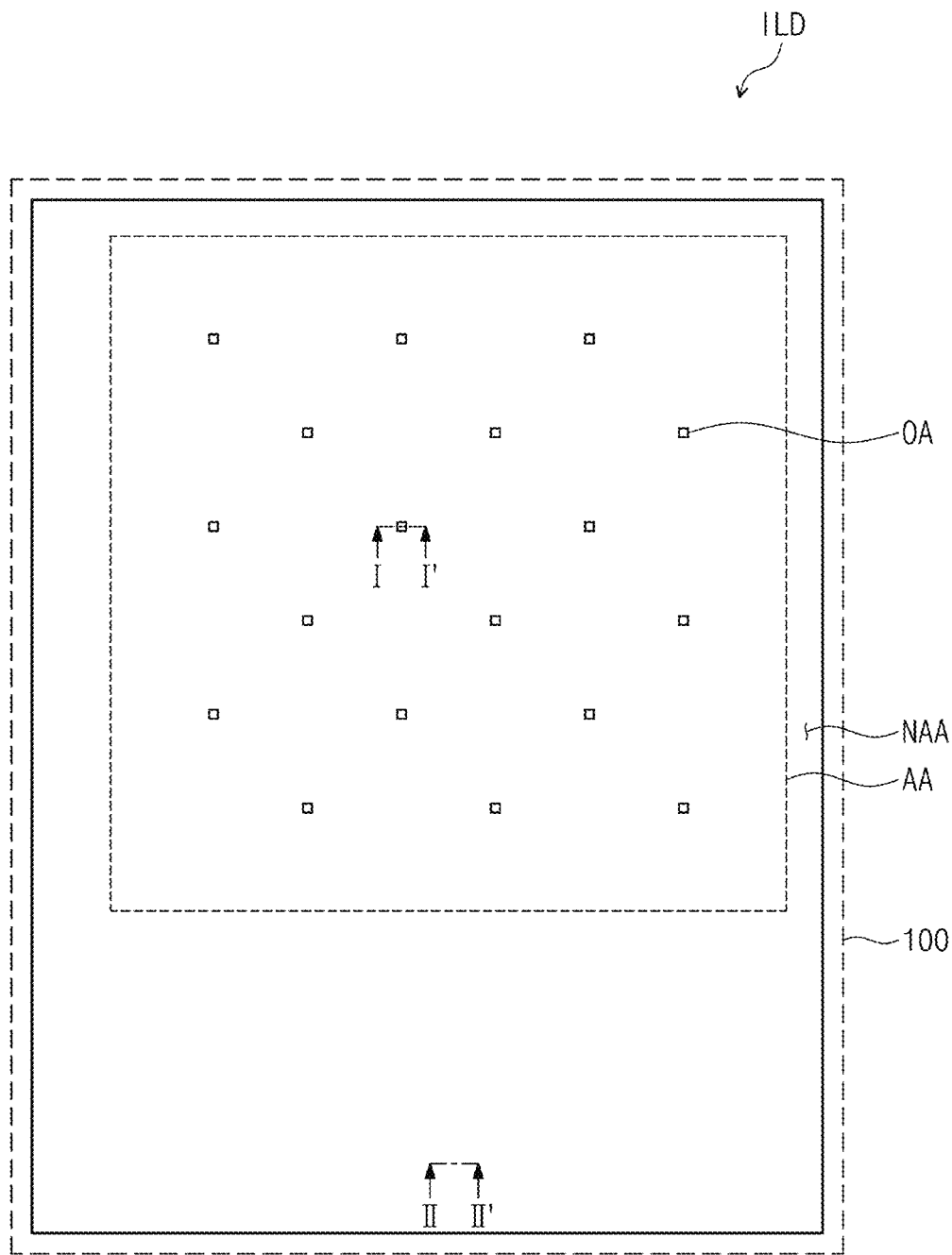
Figure 3D:
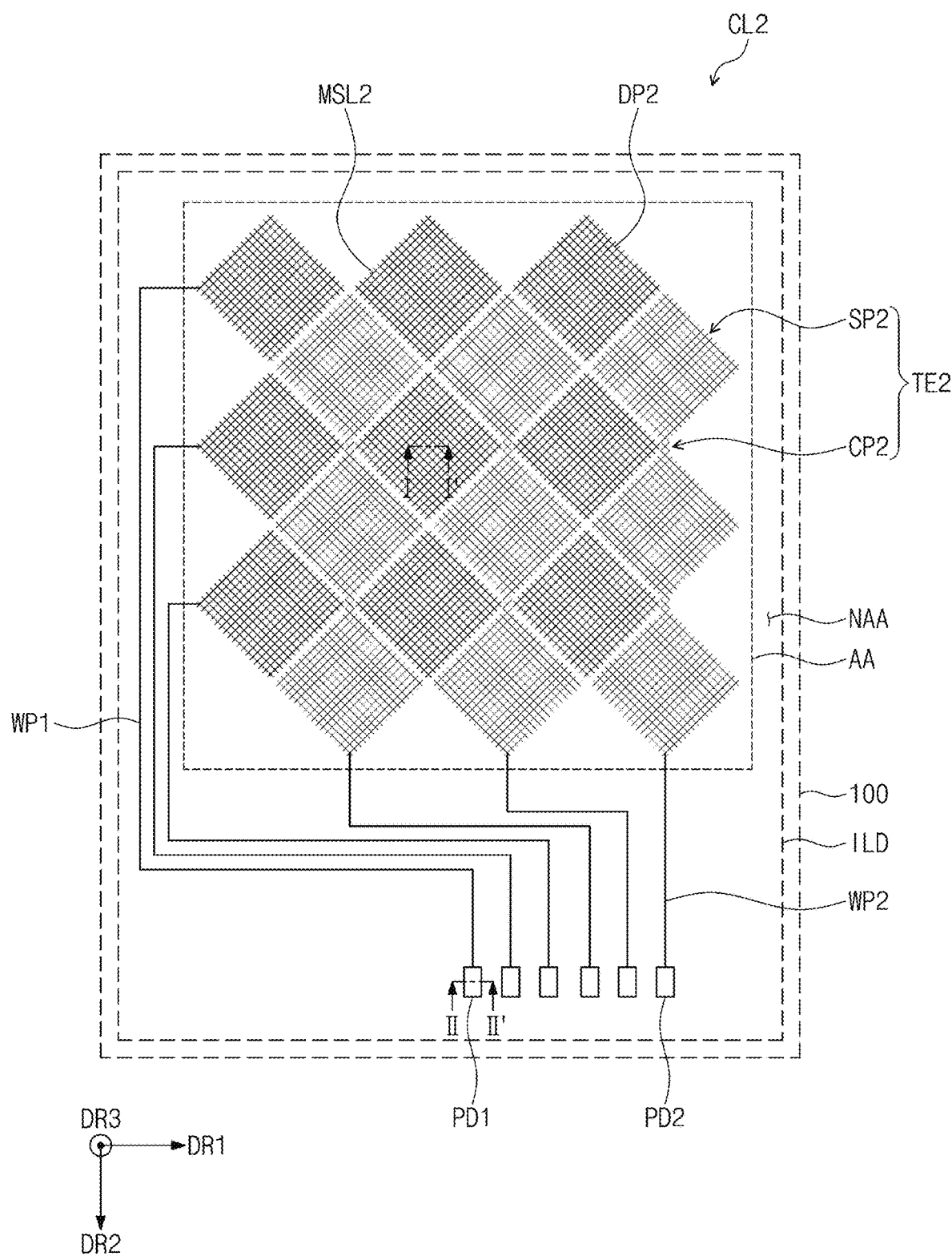

FIGS. 3A and 3B illustrate elements provided on the base structure 100, FIG. 3C illustrates the insulating layer ILD, and FIG. 3D illustrates elements provided on the insulating layer ILD. In FIGS. 3A to 3D, to reduce complexity in the drawings, the base structure 100 is illustrated by a dotted line.

Figure 4:
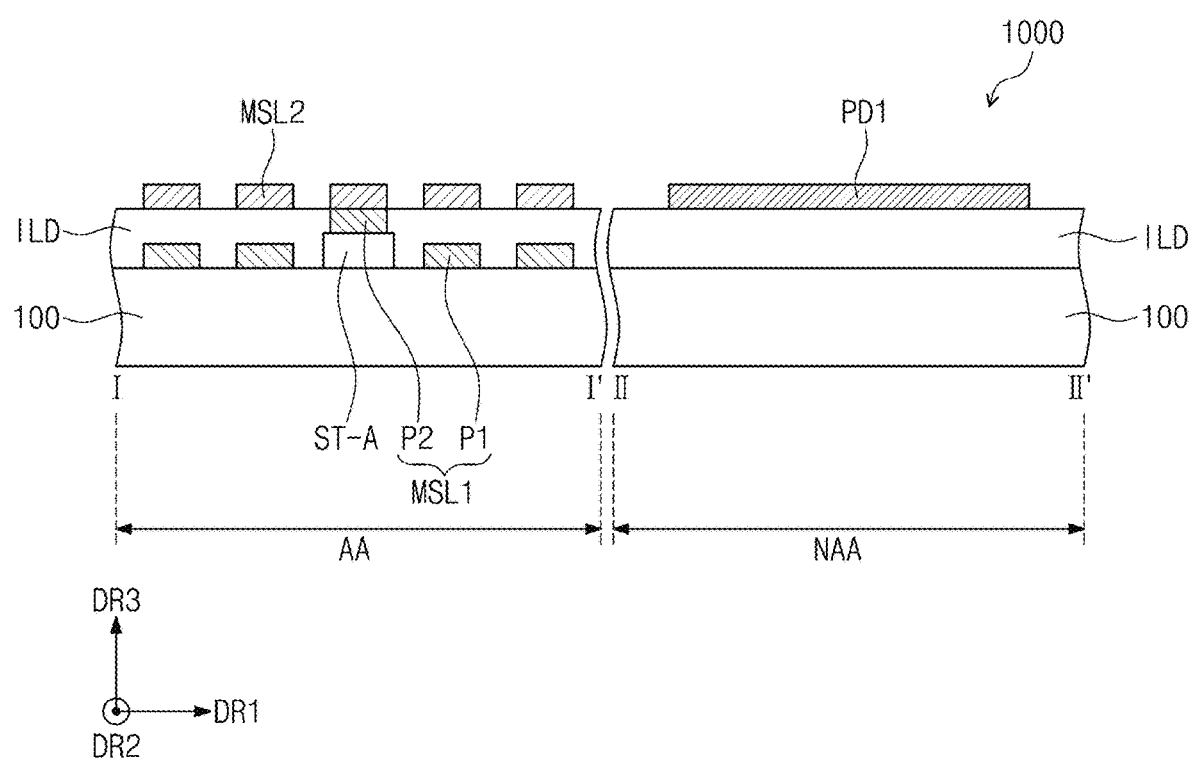
FIG. 4 is a fragmented cross-sectional view taken along lines I-I' and II-IT' of FIGS. 3A to 3D.

As shown in FIGS. 3A to 4, the electronic device 1000 may include a base structure 100, a plurality of step patterns ST, such as ST-A described below, a first conductive layer CL1, an insulating layer ILD, and a second conductive layer CL2. The first conductive layer CL1 may be provided between the base structure 100 and the insulating layer ILD, and the second conductive layer CL2 may be provided on the insulating layer ILD.

The first conductive layer CL1, the insulating layer ILD, and the second conductive layer CL2 may be sequentially stacked in an upward direction (hereinafter, a third direction DR3).

Referring to FIG. 3A, the step patterns ST may be provided on the base structure 100. The step patterns ST may be provided in the active area AA. The step patterns ST may be arranged to be spaced apart from each other.

The step patterns ST may partially overlap the first conductive layer CL1. In addition, the step patterns ST may be provided at positions corresponding to a plurality of opening areas OA, which will be described below.

The step patterns ST may be formed of or include an organic material. The step patterns ST may be transparent. However, the step patterns ST, alternatively, may be black or some other color or opacity.

As shown in FIG. 3B, the first conductive layer CL1 may be provided on the base structure 100. The first conductive layer CL1 may be disposed in the active area AA. FIG. 4 illustrates one of the step patterns ST (e.g., a step pattern ST-A).

Referring to FIGS. 3B and 4, the first conductive layer CL1 may include a first portion P1, which does not overlap the step pattern ST-A, and a second portion P2, which overlaps the step pattern ST-A. The first and second portions P1 and P2 may be connected to each other, thereby forming a single conductive pattern. The connection between the first portion P1 and the second portion P2 is shown by, for example, the grid array of continuous electrically conductive lines that pass through sectional line I-I' in FIG. 3B.

The second portion P2 may be disposed on top of the plurality of the step patterns ST. In other words, the first portion P1 may be disposed at the same level as those of the step patterns ST, and the second portion P2 may be disposed at a level higher than those of the step patterns ST. The first and second portions P1 and P2 of the first conductive layer CL1 may be classified as such based on their levels relative to the step patterns ST.

The first conductive layer CL1 may include a plurality of first sensor portions SP1, a plurality of first connecting portions CP1, and a plurality of first dummy patterns DP1. The first sensor portions SP1 and the first connecting portions CP1 may be connected to each other, thereby constituting a first electrode TE1.

The first dummy patterns DP1 may be separated from and electrically disconnected from the first sensor portions SP1 and the first connecting portions CP1. The first dummy patterns DP1 and the first sensor portions SP1 may be alternately arranged.

The first conductive layer CL1 may include a plurality of first mesh lines MSL1. Each of the first sensor portions SP1, the first connecting portions CP1, and the first dummy patterns DP1 may consist of, or include, a plurality of the first mesh lines MSL1.

The second portion P2 may consist of or include at least one mesh line. When viewed in a plan view, an area of the second portion P2 may be changed by the step pattern ST-A.

As shown in FIG. 3C, the insulating layer ILD may be disposed on the base structure 100 covering the first sensor portions SP1, the first connecting portions CP1, and the first dummy patterns DP1. The insulating layer ILD may include a transparent insulating material.

For example, the insulating layer ILD may include an organic material. The insulating layer ILD may have a flat top surface that is positioned over the first conductive layer CL1. The insulating layer ILD may be a multi-layered structure including an organic layer and an inorganic layer; but, this multi-layered structure is not required.

The insulating layer ILD may be a single structure that overlaps both of the active area AA and the peripheral area NAA. A plurality of the opening areas OA may be defined in the insulating layer ILD. The opening areas OA may be defined within the active area AA.

In the illustrated embodiments, the opening areas OA may be arranged at positions respectively corresponding to the first dummy patterns DP1 and the first sensor portions SP1, but other configurations are possible. For example, a plurality of the opening areas OA may correspond to one of the first dummy patterns DP1 or one of the first sensor portions SP1.

The insulating layer ILD may be formed to partially expose the first conductive layer CL1 through the opening areas OA. As shown in FIG. 4, a top surface of the first portion P1 may be fully covered by the insulating layer ILD. By contrast, a top surface of the second portion P2 might not be fully covered by the insulating layer ILD and may be exposed. The top surfaces of the second portion P2 and the insulating layer ILD may be substantially coplanar with each other and may thus define substantially the same plane. A side surface of the second portion P2 may be fully covered by the insulating layer ILD.

As shown in FIG. 3D, the second conductive layer CL2 may be provided on the insulating layer ILD. The second conductive layer CL2 may be disposed in the active area AA and the peripheral area NAA.

The second conductive layer CL2 may include a plurality of second sensor portions SP2, a plurality of second connecting portions CP2, and a plurality of second dummy patterns DP2, which are provided in the active area AA. The second sensor portions SP2 and the second connecting portions CP2 may be connected to each other, thereby constituting a second electrode TE2.

The second sensor portions SP2 may overlap the first dummy patterns DP1, when viewed in a plan view. The second dummy patterns DP2 may be separated from and electrically disconnected from the second sensor portions SP2 and the second connecting portions CP2.

The second dummy patterns DP2 and the second sensor portions SP2 may be alternately arranged. The second dummy patterns DP2 may overlap the first sensor portions SP1, when viewed in a plan view.

The second conductive layer CL2 may include a plurality of second mesh lines MSL2. Each of the second sensor portions SP2, the second connecting portions CP2, and the second dummy patterns DP2 may consist of the second mesh lines MSL2, but other arrangements are permissible. For example, each of the second sensor portions SP2, the second connecting portions CP2, and the second dummy patterns DP2 may have a bulk structure, rather than the mesh structure shown.

The second conductive layer CL2 may further include first wiring patterns WP1, second wiring patterns WP2, at least one first pad PD1, and at least one second pad PD2, which is are provided in the peripheral area NAA.

Referring to FIGS. 3D and 4, the second dummy patterns DP2 may overlap the opening areas OA. Here, the second dummy patterns DP2 may be in contact with the second portion P2 that is exposed by the opening areas OA. The second dummy patterns DP2 may be coupled to the second portion P2 and thereby may be connected to the first sensor portions SP1, respectively.

Similarly, the second sensor portions SP2 may overlap the opening areas OA. The second sensor portions SP2 may be in contact with the second portion P2 exposed by the opening areas OA. The second sensor portions SP2 may be coupled to the second portion P2 and thereby may be connected to the first dummy patterns DP1, respectively.

The first wiring patterns WP1, the second wiring patterns WP2, the first pads PD1, and the second pads PD2 may be provided on the insulating layer ILD. The first wiring patterns WP1 may be provided to connect the first pads PD1 to the second dummy patterns DP2, and the second wiring patterns WP2 may be provided to connect the second pads PD2 to the second sensor portions SP2.

The first pads PD1 may be provided at a level different from that of the first mesh lines MSL1 constituting the first sensor portions SP1. Since the second dummy patterns DP2 are electrically connected to the first sensor portions SP1, electrical signals provided to the first pads PD1 may be transmitted to the first sensor portions SP1.

Accordingly, all of the first wiring patterns WP1, the second wiring patterns WP2, the first pads PD1, and the second pads PD2 may be provided at the same level.

However, the first wiring patterns WP1, the second wiring patterns WP2, the first pads PD1, and the second pads PD2 may be provided at different levels.

As shown in FIG. 4, the first portion P1 may be spaced apart from the second mesh lines MSL2 with the insulating layer ILD interposed therebetween. The second portion P2 may be in direct contact with a corresponding, i.e., overlapping, one of the second mesh lines MSL2. The thickness of the insulating layer ILD may be substantially equal to a sum of thicknesses of the step pattern ST-A and the second portion P2.

The insulating layer ILD may be formed to have the same thickness as the sum of thicknesses of the step pattern ST-A and the second portion P2, and thus, the second mesh lines MSL2 may be in direct contact with the second portion P2. Accordingly, it is possible to connect two conductive patterns, which are disposed at different levels, to each other without needing to etch or otherwise engage in a process step to form a contact hole.

Hereinafter, a second embodiment of an electronic device 1000-1 will be described with reference to FIGS. 5 and 6. For concise description, elements previously described with reference to FIGS. 1 to 4 may be identified by a similar or identical reference number without repeating redundant descriptions thereof.

Figure 5:
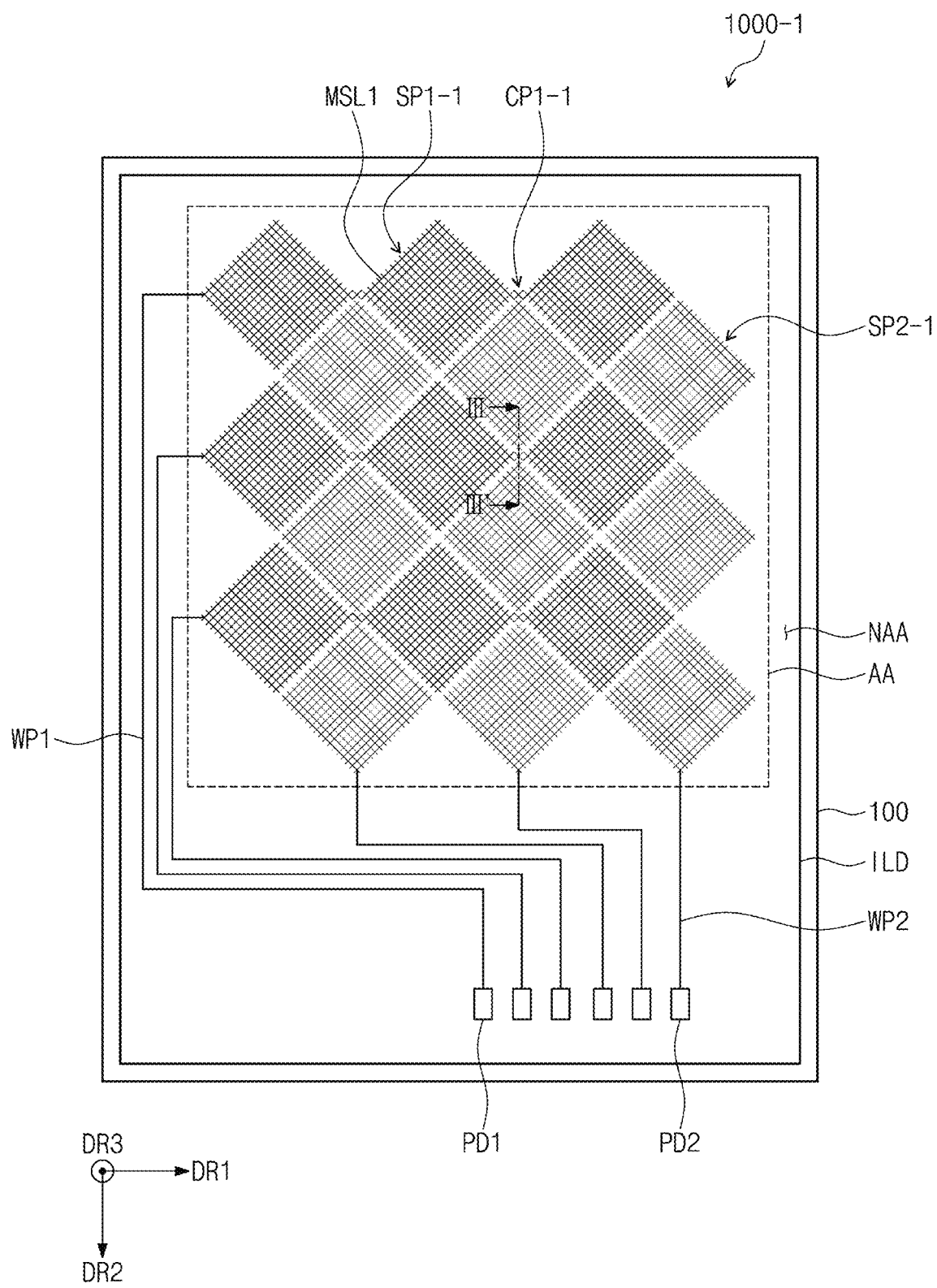
FIG. 5 is a plan view of a second embodiment of an electronic device constructed according to the principles of the invention.
Figure 6:
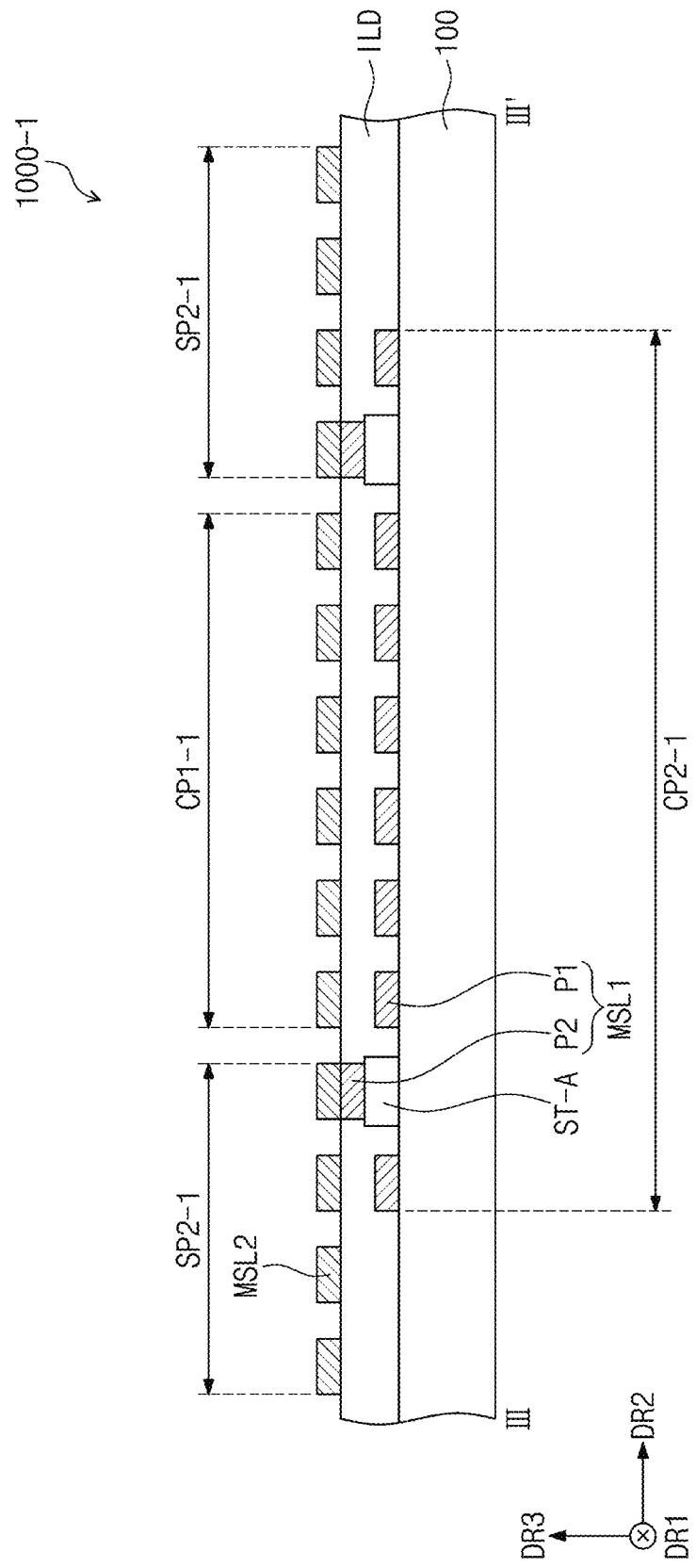
FIG. 6 is a cross-sectional view taken along line III-III' of FIG. 5.

Referring to FIGS. 5 and 6, the step patterns ST may be provided on the base structure 100. The first conductive layer CL1 may be provided on the base structure 100 and the step patterns ST.

The first conductive layer CL1 may include a plurality of second connecting portions CP2-1, each of which consists of or includes the first mesh lines MSL1.

The first mesh lines MSL1 may include the first portion P1 disposed on the base structure 100 and the second portion P2 disposed on the step patterns ST. The insulating layer ILD may be disposed on the first mesh lines MSL1 to cover the first portion P1 and to expose the second portion P2.

The second conductive layer CL2 may be provided on the insulating layer ILD. The second conductive layer CL2 may include a plurality of first sensor portions SP1-1, a plurality of first connecting portions CP1-1, and a plurality of second sensor portions SP2-1. The second conductive layer CL2 may consist of or include the second mesh lines MSL2.

The first portion P1 may be spaced apart from the second mesh lines MSL2 with the insulating layer ILD interposed therebetween. The second portion P2 may be in direct contact with a corresponding one of the second mesh lines MSL2. The thickness of the insulating layer ILD may be substantially equal to the sum of thicknesses of the step pattern ST-A and the second portion P2.

Regarding FIG. 7 and FIG. 8, for concise description, elements previously described with reference to FIGS. 1 to 6 may be identified by a similar or identical reference number without repeating redundant descriptions thereof.

Figure 7:
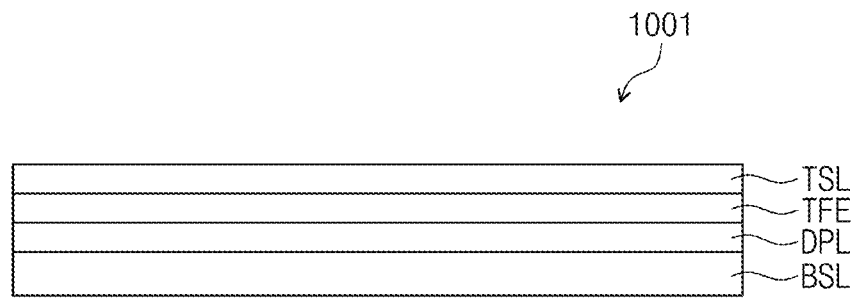
FIG. 7 is a cross-sectional view of a third embodiment of an electronic device constructed according to the principles of the invention.

Referring to FIG. 7, an electronic device 1001 may be a touch screen panel which is configured to display an image. The electronic device 1001 may include a display layer DPL, which is configured to display an image in response to electric signals applied thereto and includes a plurality of pixels.

Figure 8:
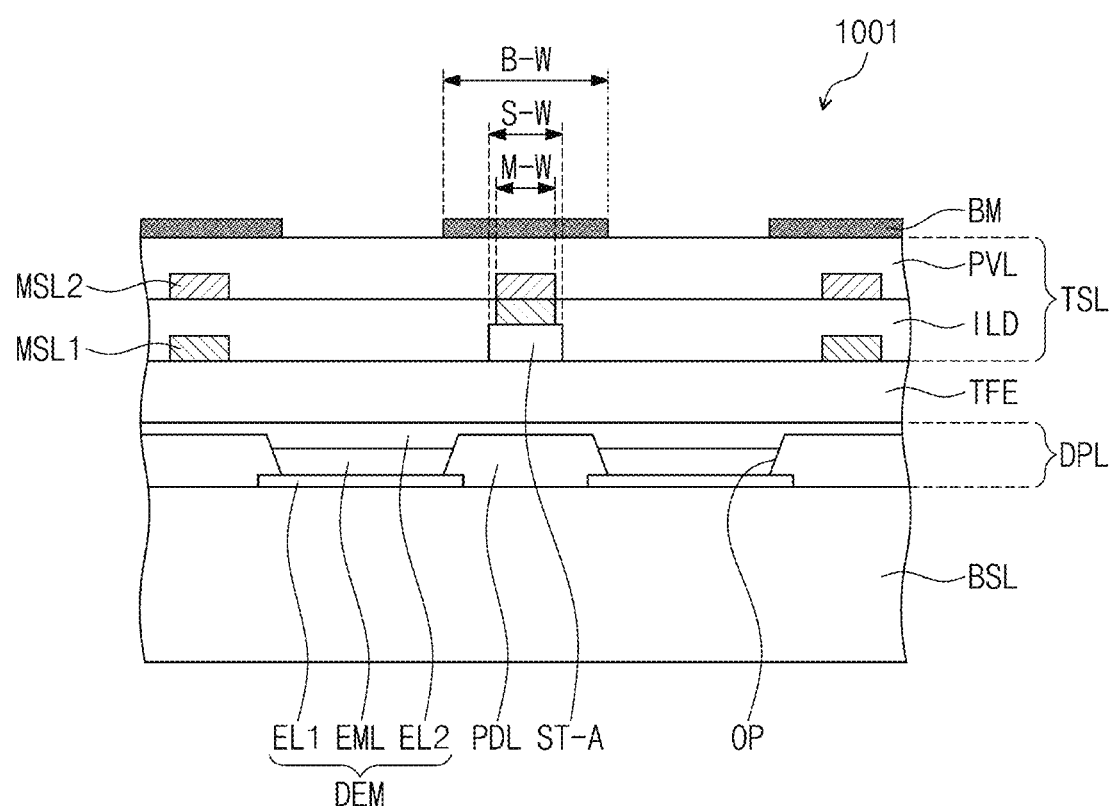
FIG. 8 is a cross-sectional view of a portion of the electronic device of FIG. 7.

As shown in FIGS. 7 and 8, the electronic device 1001 may include a base layer BSL, a thin-film encapsulation layer TFE, and a sensing layer TSL, in addition to the display layer DPL.

The base layer BSL may be formed of, or include, a flexible insulating material. The base layer BSL may correspond to the base structure 100 of the electronic device 1000 of FIG. 1.

The base layer BSL may include a plurality of insulating layers and a plurality of conductive layers. The plurality of conductive layers and the plurality of insulating layers may constitute a thin-film transistor and a capacitor which are connected to a display device DEM.

The display layer DPL may be provided between the base layer BSL and the sensing layer TSL. The display layer DPL may be operated in any one or more of front-side, back-side, or both-sides light-emitting manners.

The display layer DPL may include the display device DEM and a pixel defining layer PDL.

The display device DEM may be provided on the base layer BSL. The display device DEM may emit light corresponding to an electrical signal, which is transmitted through a thin-film transistor and a capacitor, thereby displaying an image.

The display device DEM may be realized in various manners. For example, the display device DEM may be an electrophoresis device, a liquid crystal capacitor, an electrowetting device, or an organic light emitting device. The description that follows will refer the display device DEM that is an organic light emitting device as an example.

The pixel defining layer PDL may be provided on the base layer BSL. Openings OP may be defined in the pixel defining layer PDL.

Each of the openings OP may be provided to expose a portion of a first electrode EL1 and to define an empty space enclosed by the pixel defining layer PDL. Each of the openings OP may define a region in which each display device DEM is provided.

The display device DEM may include the first electrode EL1, a light emitting layer EML, and a second electrode EL2. Depending on a potential difference between the first electrode EL1 and the second electrode EL2, the light emitting layer EML of the display device DEM may be activated to generate light.

The thin-film encapsulation layer TFE may be provided between the display layer DPL and the sensing layer TSL. The thin-film encapsulation layer TFE may have a multi-layered structure, in which organic and/or inorganic layers are stacked. The thin-film encapsulation layer TFE may be provided to seal the display layer DPL and thereby to prevent outside moisture from flowing into the display layer DPL.

The sensing layer TSL may be directly disposed on the thin-film encapsulation layer TFE. This may make it possible for the electronic device 1001 to be thinner and thereby be more portable and more foldable.

The sensing layer TSL may be configured to sense a touch event to be applied from the outside. The sensing layer TSL may correspond to the touch structure 200 of the electronic device 1000 of FIG. 1.

The first mesh lines MSL1 and the step pattern ST-A may be provided on the thin-film encapsulation layer TFE. The step pattern ST-A may include a transparent organic material. The step pattern ST-A may overlap the pixel defining layer PDL. The step pattern ST-A may have a width S-W less than that of the pixel defining layer PDL, when measured in a direction intersecting the first direction DR1 and/or the second direction DR2.

The electronic device 1001 may further include a thin-film encapsulation layer and a color filter layer interposed between the first mesh lines MSL1.

The first and second mesh lines MSL1 and MSL2 may overlap the pixel defining layer PDL but might not overlap the light emitting layer EML. Accordingly, it is possible to reduce the effect of the first and second mesh lines MSL1 and MSL2 on a display property of the electronic device 1001. The first and second mesh lines MSL1 and MSL2 may be formed of, or include, an opaque material. This may make it possible to use a wider variety of materials for the first and second mesh lines MSL1 and MSL2.

The electronic device 1001 may further include a passivation layer PVL which is provided to cover the second mesh lines MSL2. The passivation layer PVL may protect the second mesh lines MSL2.

A black matrix BM may be provided on the passivation layer PVL. The black matrix BM may overlap the pixel defining layer PDL. The black matrix BM may entirely overlap the pixel defining layer PDL. In other words, when measured in a direction intersecting the first direction DR1 and/or the second direction DR2, the width B-W of the black matrix BM may be substantially equal to that of the pixel defining layer PDL.

Figure 9:
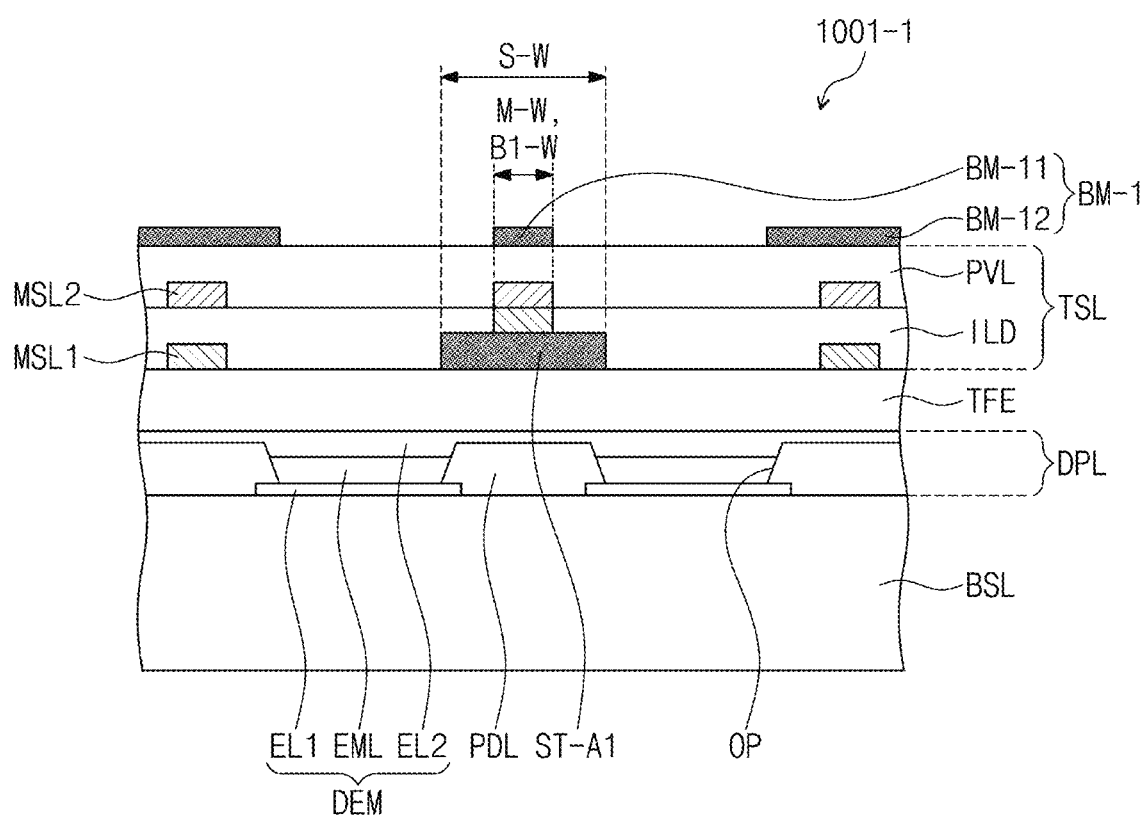
FIG. 9 is a cross-sectional view of a portion of a fourth embodiment of an electronic device constructed according to the principles of the invention.

Referring now to the fourth embodiment of FIG. 9, except for the step pattern ST-A and the black matrix BM, the electronic device 1001-1 shown in FIG. 9 may have substantially the same features as those of the electronic device 1001 of FIG. 8. For concise description, elements previously described with reference to FIG. 8 may be identified by a similar or identical reference number without repeating redundant descriptions thereof.

As shown in FIG. 9, step pattern ST-A1 may be black. The step pattern ST-A1 may entirely overlap the pixel defining layer PDL. The step pattern ST-A1 may have a width S-W that is substantially equal to that of the pixel defining layer PDL, when measured in a direction intersecting the first direction DR1 and/or the second direction DR2. Accordingly, the step pattern ST-A1 may prevent the pixel defining layer PDL, which is positioned below the step pattern ST-A1, from being seen by a user. When light generated in the display device DEM is not emitted through the openings OP and propagates toward a region adjacent to the openings OP, the step pattern ST-A1 may prevent such light from being leaked to the outside.

A black matrix BM-1 may overlap the pixel defining layer PDL. The black matrix BM-1 may include a first black matrix BM-11, which overlaps the step pattern ST-A1, and a second black matrix BM-12, which does not overlap the step pattern ST-A1.

The first black matrix BM-11 may entirely overlap a second mesh line MSL2 disposed on the step pattern ST-A1 among the plurality of the second mesh lines MSL2. Accordingly, the first black matrix BM-11 may prevent the second mesh line MSL2, which is disposed on the step pattern ST-A1, from being seen by a user. A width B 1-W of the first black matrix BM-11 may be substantially equal to a width M-W of the second mesh line MSL2, which is disposed on the step pattern ST-A1.

The second black matrix BM-12 may entirely overlap the pixel defining layer PDL disposed below the second black matrix BM-12.

Hereinafter, a method of manufacturing the electronic device 1000 will be described with reference to FIGS. 10A to 10F. For concise description, previously-described elements may be identified by a similar or identical reference number without repeating redundant descriptions thereof.

Figure 10A:
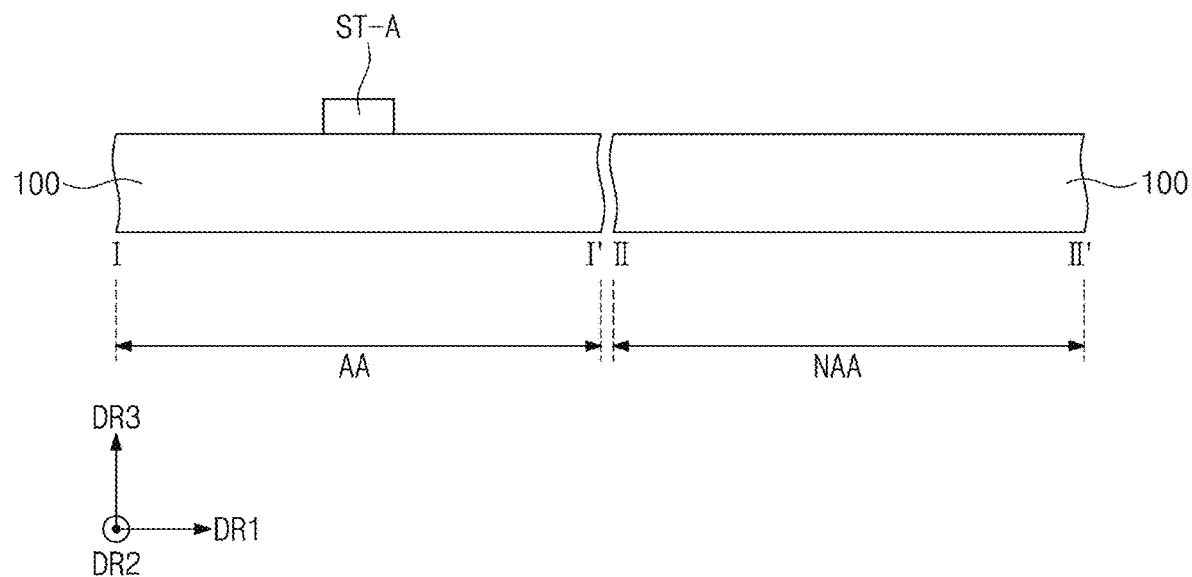
FIGS. 10A to 10F are cross-sectional views of the first embodiment of an electronic device during various stages of a method of manufacturing the electronic device according to the principles of the invention.

As shown in FIG. 10A, the step pattern ST-A may be formed on the base structure 100. The step pattern ST-A may be formed by patterning an organic layer.

Figure 10B:
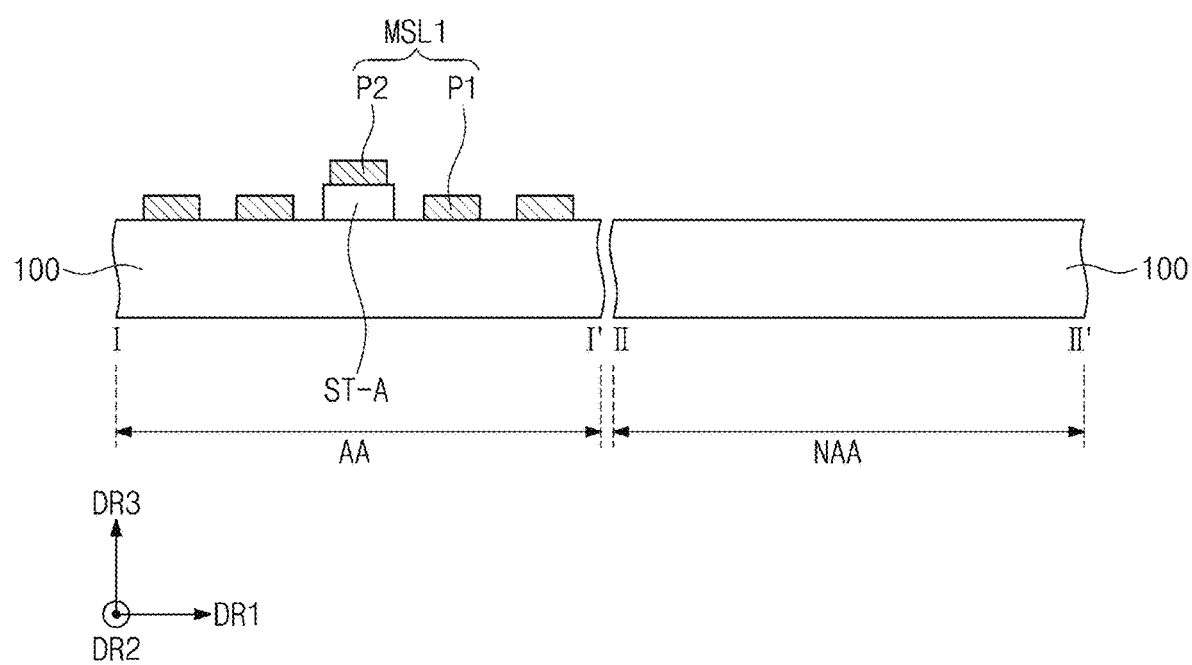

Thereafter, as shown in FIG. 10B, the first conductive layer CL1, including the plurality of the first mesh lines MSL1, may be formed on the base structure 100 and the step pattern ST-A. The first mesh lines MSL1 may be formed by patterning a conductive layer. The first portion P1 and the second portion P2 may be formed during the step of forming the first mesh lines MSL1.

The step pattern ST-A may be formed to have a thickness in the direction DR3 (e.g., z-axis) greater than that of the first portion P1. The area of the step pattern ST-A may be greater than that of the second portion P2.

Figure 10C:
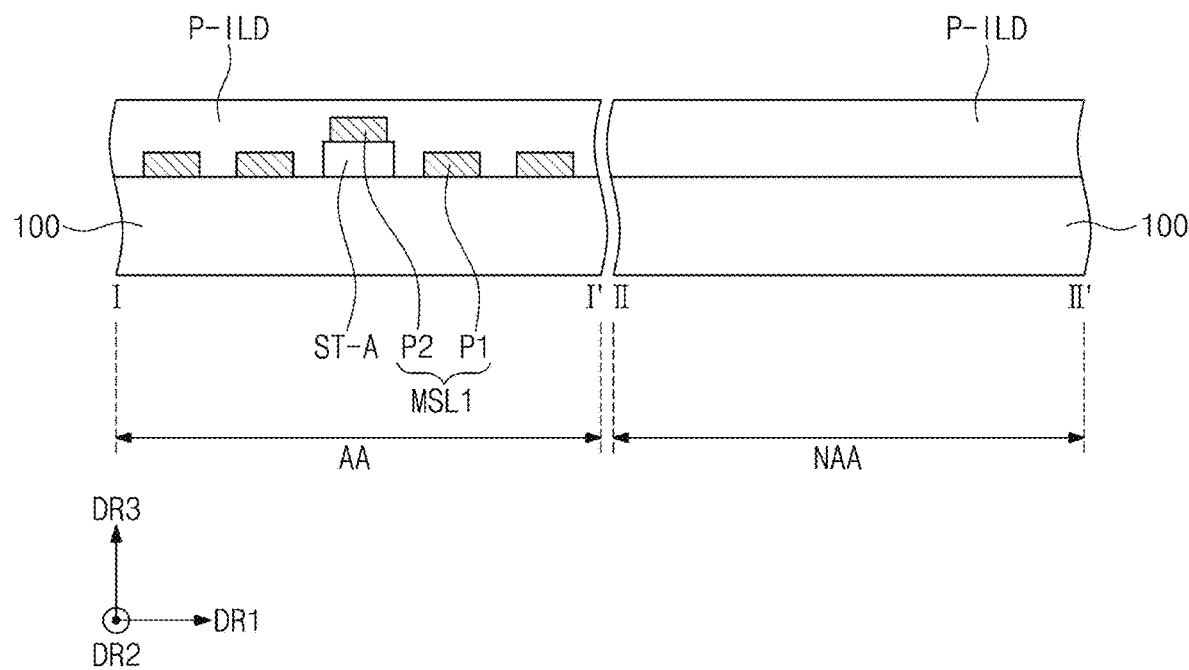

Next, as shown in FIG. 10C, a preliminary insulating layer P-ILD may be formed on the base structure 100 to cover the first mesh lines MSL1 and the step pattern ST-A. The preliminary insulating layer P-ILD may be formed to cover the first and second portions P1 and P2.

The preliminary insulating layer P-ILD may be formed to have a thickness greater than the sum of a thickness of one of the first mesh lines MSL1 and the thickness of the step pattern ST-A.

Figure 10D:
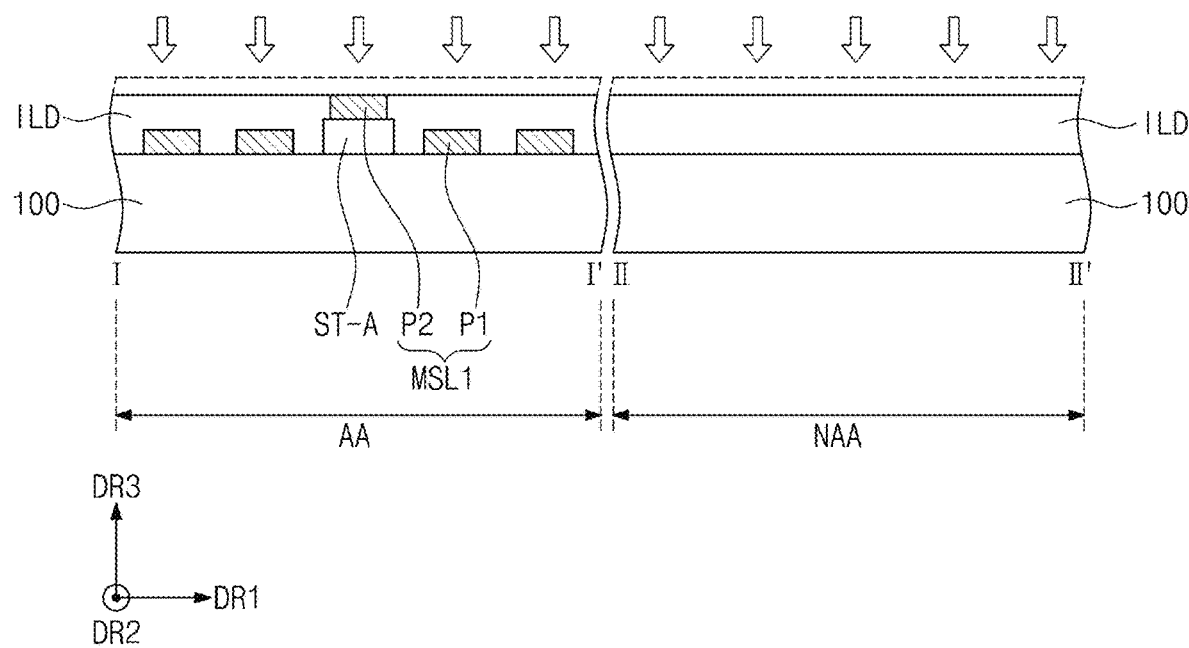
Figure 10E:
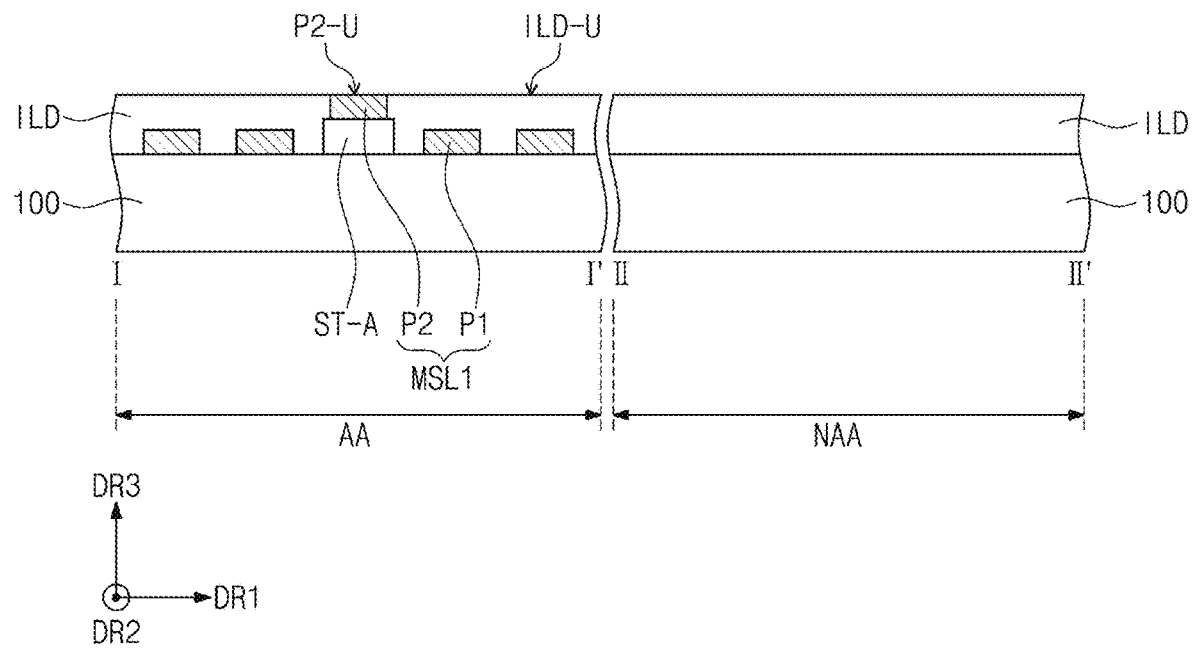

Thereafter, as shown in FIGS. 10D and 10E, the preliminary insulating layer P-ILD may be etched to form an insulating layer ILD. The insulating layer ILD may be formed by a dry etching process. For example, the dry etching process may be performed using a gaseous etching material.

The etching of the preliminary insulating layer P-ILD may be performed to expose at least a portion of a top surface P2-U of the second portion P2 of the first mesh lines MSL1.

The insulating layer ILD may be formed in such a way that its thickness is within a range capable of covering at least the first portion P1 and exposing the second portion P2. For example, the insulating layer ILD may be thicker than the step pattern ST-A and may be thinner than a sum of thicknesses of the step pattern ST-A and the second portion P2.

The insulating layer ILD is depicted in this example as having substantially the same thickness as the sum of thicknesses of the step pattern ST-A and the second portion P2. Accordingly, the top surface P2-U of the second portion P2 may be substantially coplanar with a top surface ILD-U of the insulating layer ILD.

Figure 10F:
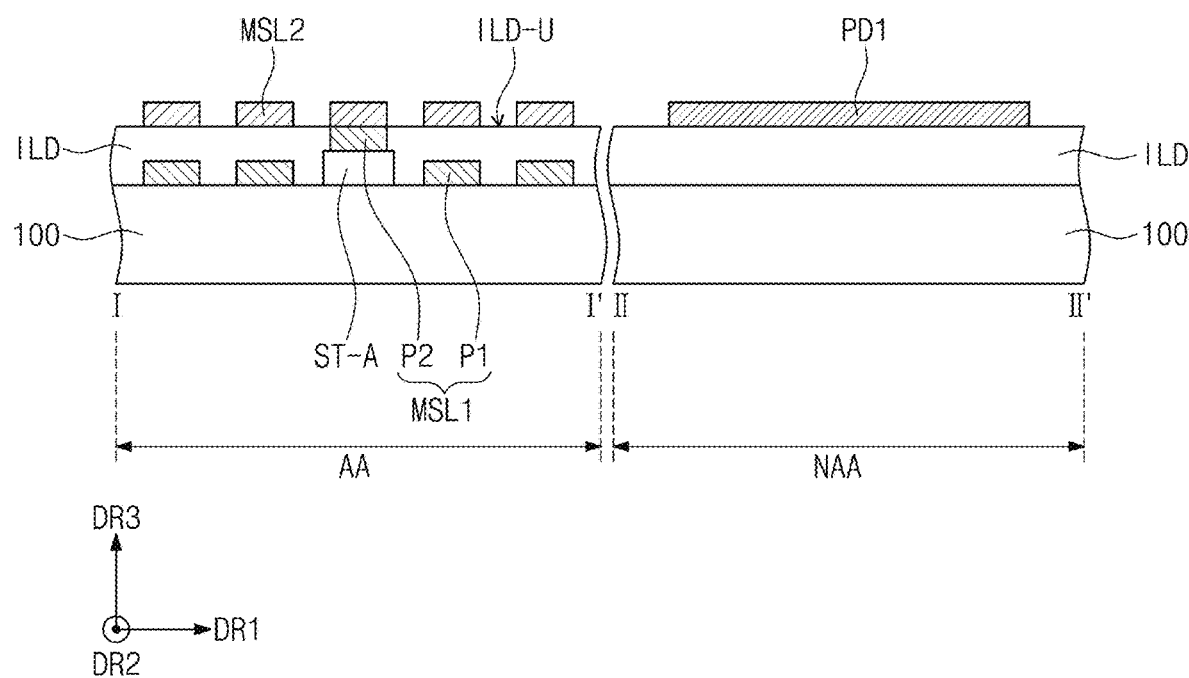

Thereafter, as shown in FIG. 10F, the second conductive layer CL2 including a plurality of the second mesh lines MSL2 may be formed on the insulating layer ILD and the first mesh lines MSL1. On the first portion P1, the second mesh lines MSL2 may be formed to be in contact with the top surface ILD-U of the insulating layer ILD. On the second portion P2, the second mesh lines MSL2 may be formed to be in contact with the top surface P2-U of the second portion P2.

The first pad PD1 may be formed on the top surface ILD-U of the insulating layer ILD. The first pad PD1 may be formed at the same time as the second mesh lines MSL2.

According to the principles of the invention described herein, even if a contact hole is not formed in the insulating layer ILD, the first conductive layer CL1 readily can be coupled to the second conductive layer CL2. Accordingly, even when an additional photolithography or other process step for forming a contact hole is omitted, the first and second conductive layers CL1 and CL2 can be coupled to each other by only an etching process.

In the electronic device 1000, the second portion P2 exposed by the etching process may be in contact with a corresponding one of the second mesh lines MSL2. Accordingly, it is possible to reduce both the process time and the cost of manufacturing the display device.

According to the principles of the invention described herein, it is possible to readily couple two conductive patterns located at different levels to each other.

And, thus, according to the principles of the invention described herein, it is possible to simplify the process of manufacturing an electronic device by eliminating an additional step in the manufacturing process.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. An electronic device, comprising:
a base layer;
a thin-film transistor disposed on the base layer;
a display layer electrically connected with the thin-film transistor, and comprising a pixel defining layer having an opening;
a sensing layer disposed on the display layer, and comprising a first conductive layer and a second conductive layer disposed on a different layer from the first conductive layer; and
a black matrix disposed on the sensing layer,
wherein:
the pixel defining layer and the black matrix overlap each other when viewed in a plan view;
the first conductive layer includes a first connecting portion;
the second conductive layer includes a plurality of first sensor portions, a plurality of second sensor portions, each of the first sensor portions and each of the second sensor portions including a plurality of mesh lines, and a plurality of second connecting portions respectively electrically connecting adjacent ones of the second sensor portions to each other;
the first connecting portion electrically connects adjacent ones of the first sensor portions to each other; and
the first sensor portions and the second sensor portions do not overlap any portion of the opening when viewed in the plan view.

2. The electronic device of claim 1, further comprising a thin-film encapsulation layer disposed on the display layer, wherein the sensing layer is directly disposed on the thin-film encapsulation layer.

3. The electronic device of claim 2, wherein the thin-film encapsulation layer comprises a plurality of organic layers and an inorganic layer.

4. The electronic device of claim 1, wherein the sensing layer further comprises a passivation layer disposed on the second conductive layer.

5. The electronic device of claim 4, wherein the black matrix is directly disposed on the passivation layer.

6. The electronic device of claim 1, wherein the display layer further comprises a light emitting layer disposed in the opening, and
wherein the second sensor portions are non-overlapping with the light emitting layer.

7. The electronic device of claim 1, wherein the black matrix covers the first conductive layer and the second conductive layer when viewed in the plan view.

8. The electronic device of claim 1, the black matrix covers the second sensor portions and the pixel defining layer when viewed in the plan view.

9. The electronic device of claim 1, wherein a width of the second sensor portions is less than a width of the respective pixel defining layer and a width of the respective black matrix.

10. The electronic device of claim 9, wherein the width of the black matrix is greater than the width of the pixel defining layer.

11. An electronic device, comprising:
a base layer;
a thin-film transistor disposed on the base layer;
a display layer comprising a pixel defining layer having an opening defined therein and a light emitting layer electrically connected with the thin-film transistor and disposed in the opening;
a sensing layer disposed on the display layer, and comprising a first electrode and a second electrode including a plurality of second sensor portions, each of the second sensor portions including a plurality of mesh lines, and a plurality of second connecting portions respectively electrically connecting adjacent ones of the second sensor portions to each other; and
a black matrix disposed on the sensing layer,
wherein:
the pixel defining layer, the first electrode, the second electrode, and the black matrix overlap each other when viewed in a plan view; and
the second sensor portions do not overlap any portion of the light emitting layer when viewed in the plan view.

12. The electronic device of claim 11, further comprising a thin-film encapsulation layer disposed on the display layer, wherein the sensing layer is directly disposed on the thin-film encapsulation layer.

13. The electronic device of claim 11, wherein the black matrix is non-overlapping with the opening.

14. The electronic device of claim 11, wherein the black matrix covers the first electrode and the second electrode when viewed in the plan view.

15. The electronic device of claim 11, wherein:
a width of each of the plurality of mesh lines is less than a width of the pixel defining layer and a width of the black matrix.

16. The electronic device of claim 15, wherein the plurality of mesh lines comprise a plurality of first mesh lines extending in a first direction and a plurality of second mesh lines extending in a second direction crossing the first direction.

17. The electronic device of claim 16, wherein the plurality of first mesh lines and the plurality of second mesh lines define a mesh opening when viewed in the plan view.

18. The electronic device of claim 11, wherein the sensing layer further comprises a passivation layer disposed on the second electrode.

19. The electronic device of claim 18, wherein the black matrix is directly disposed on the passivation layer.

20. An electronic device, comprising:
a base layer;
a thin-film transistor disposed on the base layer;
a display layer comprising a pixel defining layer having an opening defined therein and a light emitting layer electrically connected with the thin-film transistor and disposed in the opening;
a sensing layer disposed on the display layer, and comprising a first electrode including a first connecting portion and a second electrode including a plurality of first sensor portions, a plurality of second sensor portions, each of the second sensor portions including a plurality of mesh lines, and a plurality of second connecting portions respectively electrically connecting adjacent ones of the second sensor portions to each other; and a black matrix disposed on the sensing layer,
wherein:
the pixel defining layer, the first electrode, the second electrode, and the black matrix overlap each other when viewed in a plan view;
the first sensor portions and the second sensor portions do not overlap any portion of the opening when viewed in the plan view; and
the first connecting portion electrically connecting adjacent ones of the first sensor portions to each other.

21. The electronic device of claim 20, further comprising a thin-film encapsulation layer disposed on the display layer,
wherein the sensing layer is directly disposed on the thin-film encapsulation layer.

22. The electronic device of claim 20, wherein the black matrix covers the first electrode and the second electrode when viewed in the plan view.

23. The electronic device of claim 20, wherein:
a width of each of the plurality of mesh lines is less than a width of the pixel defining layer.

24. The electronic device of claim 20, wherein the first electrode comprises a plurality of mesh lines extending in a first direction, and
wherein the mesh lines of the second electrode extend in a second direction crossing the first direction.

25. The electronic device of claim 24, wherein the mesh lines of the first electrode and the mesh lines of the second electrode define a mesh opening when viewed in the plan view.

26. The electronic device of claim 20, wherein:
the sensing layer further comprises a passivation layer disposed on the second electrode; and
the black matrix is directly disposed on the passivation layer.

* * * * *